US006878918B2

(12) United States Patent
Dosluoglu (10) Patent No.: US 6,878,918 B2
(45) Date of Patent: Apr. 12, 2005

(54) APS PIXEL WITH RESET NOISE SUPPRESSION AND PROGRAMMABLE BINNING CAPABILITY

(75) Inventor: Taner Dosluoglu, New York, NY (US)

(73) Assignee: Dialdg Semiconductor GmbH, Kirchheim (DE)

( * ) Notice: Subject to any disclaimer, the term of this patent is extended or adjusted under 35 U.S.C. 154(b) by 163 days.

(21) Appl. No.: 10/339,189

(22) Filed: Jan. 9, 2003

(65) Prior Publication Data

US 2004/0135063 A1 Jul. 15, 2004

(51) Int. Cl.[7] ................................................. H01L 27/00
(52) U.S. Cl. ............................... 250/208.1; 250/214.1; 348/308; 257/222
(58) Field of Search ..................... 250/208.1, 214.1; 257/222, 290, 292; 348/308, 310

(56) References Cited

U.S. PATENT DOCUMENTS

| 5,134,488 | A | | 7/1992 | Sauer ..................... 358/213.11 |
| 5,134,489 | A | | 7/1992 | Sauer ..................... 358/213.26 |
| 5,848,123 | A | | 12/1998 | Strommer ................... 378/98.8 |
| 5,970,115 | A | | 10/1999 | Colbeth et al. ............... 378/62 |
| 6,365,926 | B1 | * | 4/2002 | Guidash ..................... 257/292 |
| 6,424,750 | B1 | | 7/2002 | Colbeth et al. ............. 382/260 |
| 6,452,153 | B1 | | 9/2002 | Lauxtermann et al. ... 250/208.1 |
| 6,657,180 | B1 | * | 12/2003 | Monnet et al. .......... 250/214.1 |
| 6,756,616 | B2 | * | 6/2004 | Rhodes ....................... 257/291 |
| 6,759,641 | B1 | * | 7/2004 | Loose ..................... 250/208.1 |

* cited by examiner

Primary Examiner—Stephone B. Allen
Assistant Examiner—Patrick J. Lee
(74) Attorney, Agent, or Firm—George O. Saile; Stephen B. Ackerman; Larry J. Prescott (57) ABSTRACT

A circuit and method are described which suppresses reset noise in active pixel sensor arrays. A circuit having a number of $N^-$ wells formed in a $P^-$ silicon epitaxial layer or a number of $P^-$ wells formed in an $N^-$ silicon epitaxial layer is provided. A pixel is formed in each of the wells so that each of the wells is surrounded by silicon of the opposite polarity and an array of pixels is formed. Means are provided for selectively combining or binning adjacent $N^-$ or $P^-$ wells. During the reset period of the imaging cycle selected groups of adjacent pixels are binned and the charge injected by the resetting of a pixel is averaged among the neighboring pixels, thereby reducing the effect of this charge injection on any one of the pixels and thus reducing the noise generated. The reset is accomplished using a PMOS transistor formed in each $N^-$ well or an NMOS transistor formed in each $P^-$ well. The selective binning is accomplished using NMOS or PMOS transistors formed in the region between adjacent wells. Conductive traces between adjacent wells can also be used to accomplish the selective binning.

32 Claims, 6 Drawing Sheets

APS PIXEL WITH RESET NOISE SUPPRESSION AND PROGRAMMABLE BINNING CAPABILITY

BACKGROUND OF THE INVENTION (1) Field of the Invention

This invention relates to a circuit and method for suppressing noise during pixel reset and more specifically to using programmable binning to selectively bin adjacent pixels during reset.

(2) Description of the Related Art

In optical imagers noise resulting from switching between pixels is a very important consideration. Control of this noise is a very important consideration in these optical imagers.

U.S. Pat. No. 6,452,153 B1 to Lauxterman et al. describes an optoelectronic sensor having at least two sensors and binning between sensors.

U.S. Pat. No. 6,424,750 B1 to Colbeth et al. describes an X-Ray imaging system. In one aspect of the invention pixel binning is used to combine pixel information collected by the detector array.

U.S. Pat. No. 5,970,115 to Colbeth et al. describes radiation imaging systems, in particular X-Ray radiation systems, capable of operating in multiple detection and display modes.

U.S. Pat. No. 5,848,123 to Strommer describes methods and apparatus for imaging an object by detecting radiation reflected from and/or transmitted through the object using an imaging sensor system. The sensor system is configured by means of a control scheme based on combining or binning the imaging elements.

U.S. Pat. No. 5,134,488 and U.S. Pat. No. 5,134,489 to Sauer describe an Y addressable solid state imager.

SUMMARY OF THE INVENTION

Electrical noise is a fundamental limitation in any electronic circuit, and control of noise is especially important in optical imaging system. Switching noise generated by reading out an array of pixels causes undesirable noise in the image and represents a fundamental limitation of the sensitivity of the optical system.

It is a principle objective of this invention to provide an imaging circuit having pixels and reset noise suppression.

It is another principle objective of this invention to provide a method of suppressing reset noise in an imaging circuit.

These objectives are achieved by providing a circuit having a number of $N^-$ wells formed in a $P^-$ silicon epitaxial layer. A pixel is formed in each of the $N^-$ wells so that each of the $N^-$ wells is surrounded by $P^-$ type silicon and an array of pixels is formed. Means are provided for selectively combining or binning adjacent $N^-$ wells. During the reset period of the imaging cycle selected groups of adjacent pixels are binned and the charge injected by the resetting of a pixel is averaged among the neighboring pixels, thereby reducing the effect of this charge injection on any one of the pixels and thus reducing the noise generated.

One means for binning the pixels is to connect selected $N^-$ wells with selected adjacent $N^-$ wells using traces of conductive material formed over the $P^-$ regions between the selected $N^-$ wells. This electrically connects or bins the selected adjacent $N^-$ wells. Another method of binning pixels is to form $N^+$ channel regions between the selected adjacent $N^-$ wells followed by forming a gate dielectric and gate electrode over the $N^+$ channel regions. This forms an N channel metal oxide semiconductor, NMOS, transistor which can be used to connect or disconnect the selected adjacent $N^-$ wells as desired by turning the NMOS transistors on or off.

These objectives can also be achieved by providing a circuit having a number of $P^-$ wells formed in an $N^-$ silicon epitaxial layer. A pixel is formed in each of the $P^-$ wells so that each of the $P^-$ wells is surrounded by $N^-$ type silicon and an array of pixels is formed. Means are provided for selectively combining or binning adjacent $P^-$ wells. During the reset period of the imaging cycle selected groups of adjacent pixels are binned and the charge injected by the resetting of a pixel is averaged among the neighboring pixels, thereby reducing the effect of this charge injection on any one of the pixels and thus reducing the noise generated.

One means for binning the pixels is to connect selected $P^-$ wells with selected adjacent $P^-$ wells using traces of conductive material formed over the $N^-$ regions between the selected $P^-$ wells. This electrically connects or bins the selected adjacent $P^-$ wells. Another method of binning pixels is to form $P^+$ channel regions between the selected adjacent $P^-$ wells followed by forming a gate dielectric and gate electrode over the $P^+$ channel regions. This forms a P channel metal oxide semiconductor, PMOS, transistor which can be used to connect or disconnect the selected adjacent $P^-$ wells as desired by turning the PMOS transistors on or off.

DESCRIPTION OF THE PREFERRED EMBODIMENTS

Figure 1:
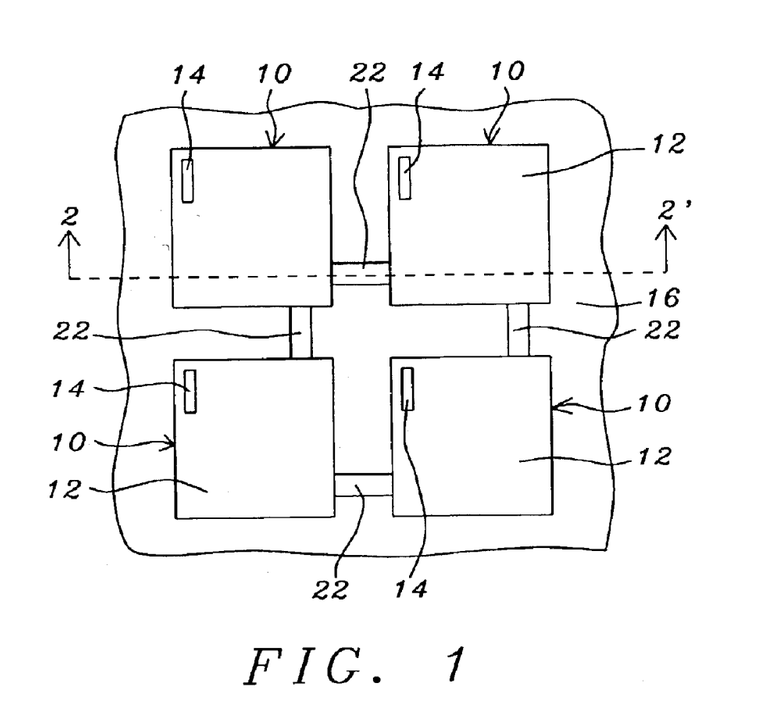
FIG. 1 shows a top view of an array of pixels formed in $N^-$ or $P^-$ wells showing a reset transistor in each $N^-$ or $P^-$ well and binning connections between adjacent $N^-$ or $P^-$ wells.

Refer now to FIGS. 1–7 and 8A for a detailed description of a preferred embodiment of the circuit and method of this invention. FIG. 1 shows part of an active pixel sensor, APS, array with four pixels 12 shown in FIG. 1. Each of the pixels 10 comprise an N⁻ well 12 formed in a layer of P⁻ epitaxial silicon 16. The junction between these N⁻ wells and the P⁻ substrate forms a number of photodiodes. A reset transistor 14 is formed in each of the N⁻ wells 12 and is used to reset the pixel after the charge integration period has been completed and the charge accumulated by the pixel has been read. As an example the reset transistor 14 is a P channel metal oxide semiconductor, PMOS, transistor formed in each of the N⁻ wells. The N⁻ well is reverse biased relative to the P⁻ epitaxial silicon layer. During the first part of the cycle a signal incident on the pixel causes the charge stored at this reverse biased PN junction to decay. This signal is usually optical radiation, however other signals may be used to cause this charge decay. After the charge on the pixel has been read the PMOS transistor can be turned on to inject negative charge into the N⁻ well and restore the pixel charge to its initial value.

Figure 2:
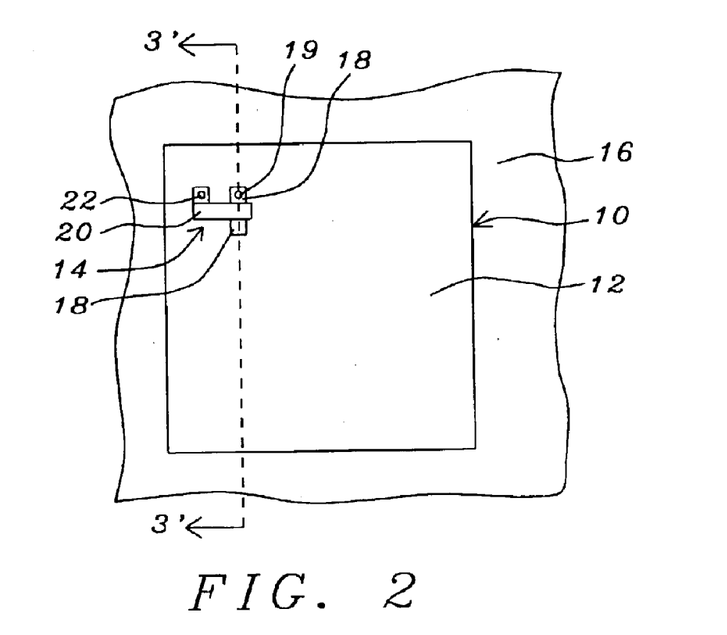
FIG. 2 shows a top view of one of the pixels of FIG. 1 showing the reset transistor in greater detail.
Figure 3:
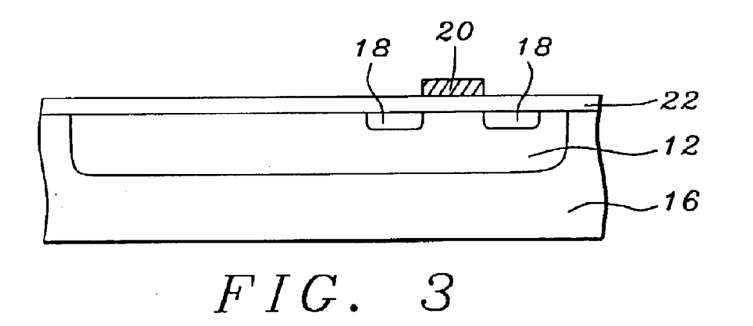
FIG. 3 shows a cross section view of the pixel of FIG. 2 taken along line 3–3' of FIG. 2.

FIGS. 2 and 3 show a more detailed view of the reset transistor. FIG. 2 shows a top view and FIG. 3 a cross section view taken along line 3–3' of FIG. 2. Two P regions 18 are formed in the N⁻ well to form source and drain regions. A gate oxide 22 is formed over the part of the N⁻ well between the two P regions 18, see FIG. 2. An electrical contact 21 is formed to the gate electrode 20 and an electrical contact 19 is formed to one of the P regions 18 to form a source connection. The other P region 18 forms the drain and is in contact with the N⁻ well forming the connection to the photodiode formed by the N⁻ well and the P⁻ substrate.

Figure 4:
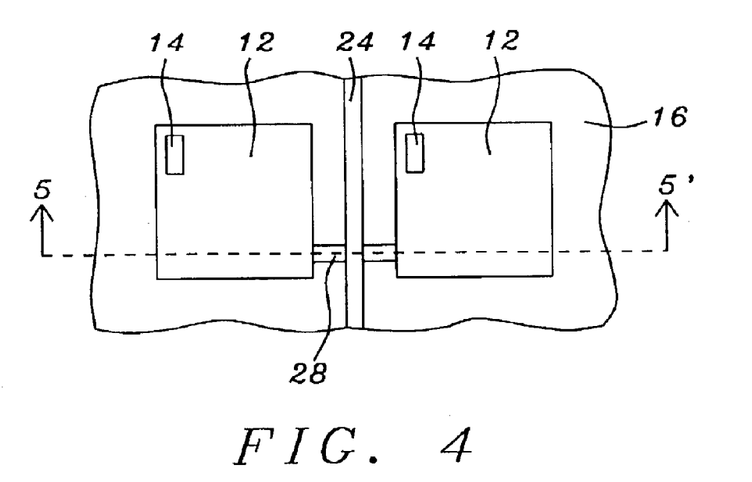
FIG. 4 shows a top view of two adjacent pixels formed in $N^-$ or $P^-$ wells having an NMOS or a PMOS transistor for binning connection and an electrical conductor used to turn the transistor on or off.
Figure 5:
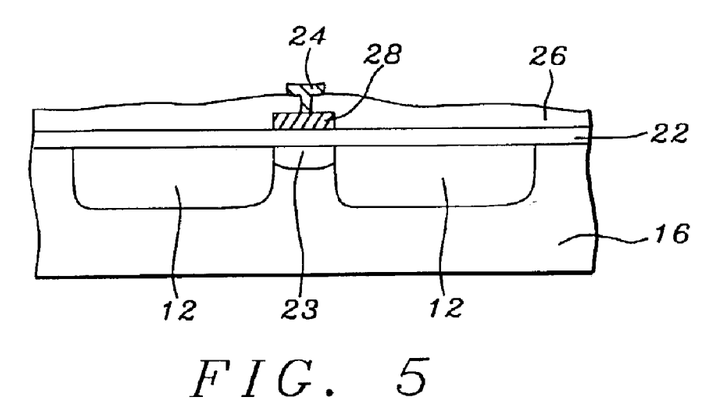
FIG. 5 shows a cross section view of the pixels of FIG. 4 taken along line 5–5' of FIG. 4.

FIG. 1 shows a number of interconnections 22 between selected adjacent pixels. These interconnections can be conductive traces which form a hard connection between selected N⁻ wells 12 or can be switches which can be programmed to select different combinations of N⁻ wells 12 at different times. FIGS. 4 and 5 show the case where the interconnections are switches formed by N channel metal oxide semiconductor, NMOS, transistors. FIG. 4 shows a top view and FIG. 5 a cross section view, taken along line 5–5' of FIG. 4, of two adjacent N⁻ wells 12 connected by an NMOS binning transistor. The N⁻ wells 12 each have a PMOS reset transistor 14 formed therein. The NMOS binning transistor is formed by forming an N⁺ channel region 23 between two adjacent N⁻ wells 12, see FIG. 5. A gate electrode 28 is formed over the N⁺ channel region 23 with a layer of gate dielectric 22 formed between the gate electrode 28 and the N⁺ channel region 23, see FIG. 5. A layer of second dielectric 26 is formed over the gate electrode 28 and the layer of gate dielectric 22 so that a conducting electrode 24 can be routed across the pixel array to contact the gate electrodes.

Figure 6:
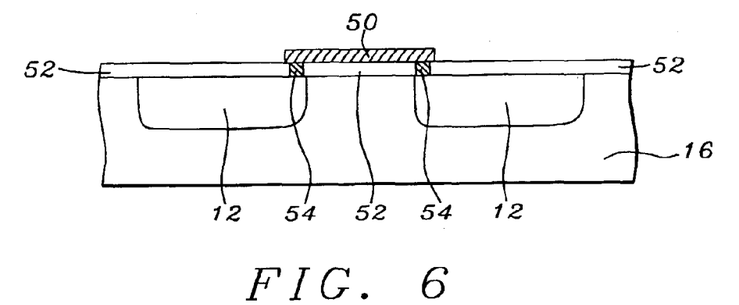
FIG. 6 shows a cross section view, taken along line 6–6' of FIG. 1, of two adjacent pixels formed in $N^-$ or $P^-$ wells having conductive traces for binning connections.

Returning to FIG. 1 the interconnections between selected N⁻ wells 12 can be conductive traces which form permanent binning connections. FIG. 6 is a cross section view of two adjacent N⁻ wells of FIG. 1 taken along line 6–6' of FIG. 1 showing permanent binning connections. As shown in FIG. 6 a layer of dielectric 52 is formed over the N⁻ wells 12 and the intervening P⁻ epitaxial silicon 16. A conducting electrode 50 is formed on the layer of dielectric 52. Electrical contacts 54 are then formed through the dielectric 52 between each end of the conducting electrode 50 and the two N⁻ wells 12.

Figure 7:
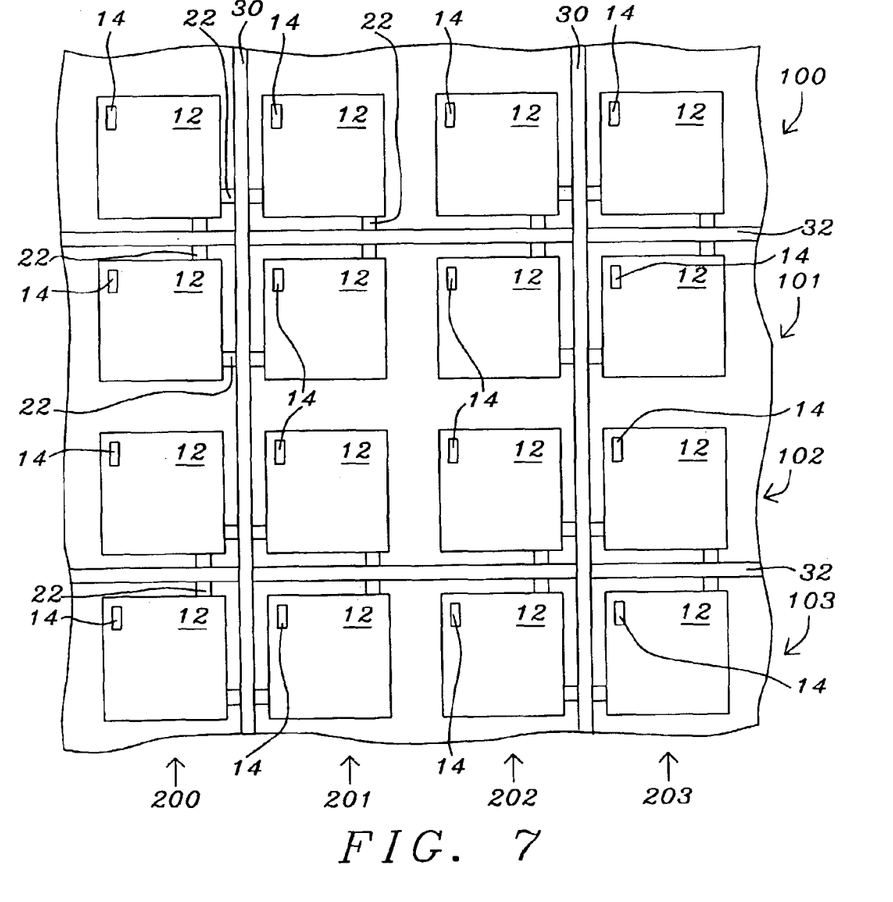
FIG. 7 shows a top view of an array of pixels formed in $N^-$ or $P^-$ wells with binning connections between selected adjacent $N^-$ or $P^-$ wells.

FIG. 7 shows a top view of a part of an array of N⁻ wells 12, or pixels, arranged in rows and columns with a PMOS reset transistor 14 in each of the N⁻ wells. FIG. 7 shows four rows; 100, 101, 102, and 103; of N⁻ wells 12 and four columns; 200, 201, 202, 203; of N⁻ wells 12. While the part of the array shown in FIG. 7 shows four rows and four columns of pixels there could be more or fewer than four rows of N⁻ wells 12 and more or fewer than four columns of N⁻ wells 12. In the array shown in FIG. 7 the binning connections are NMOS transistors as previously described. Vertical electrodes 30 between selected columns of N⁻ wells 12, between columns 200 and 201 and between columns 202 and 203, form electrical connection to the gate electrodes 22 of the NMOS binning transistors connecting the N⁻ wells 12 in one of the selected columns to the adjacent N⁻ wells 12 in the adjacent selected column. In this example the connections are between each of the N⁻ wells 12 in column 200 and the adjacent N⁻ wells 12 in column 201 and between each of the N⁻ wells 12 in column 202 and the adjacent N⁻ wells 12 in column 203.

In like manner, horizontal electrodes 32 between selected rows of N⁻ wells 12 form electrical connection to the gate electrodes 22 of the NMOS binning transistors connecting the N⁻ wells 12 in one of the selected rows to the adjacent N⁻ wells 12 in the adjacent selected row. In this example the connections are between each of the N⁻ wells 12 in row 100 and the adjacent N⁻ wells 12 in row 101 and between each of the N⁻ wells 12 in row 102 and the adjacent N⁻ wells 12 in row 103. The connections shown in this example result in sub-arrays of four N⁻ wells which can be binned in groups of two or four depending on which NMOS binning transistors are turned on and isolated from one another when the NMOS transistors are turned off. Different arrays and different electrical connections can aggregate different sub arrays when the binning transistors are turned on. An entire array of N⁻ wells could be binned if that were desired.

Figure 8A:
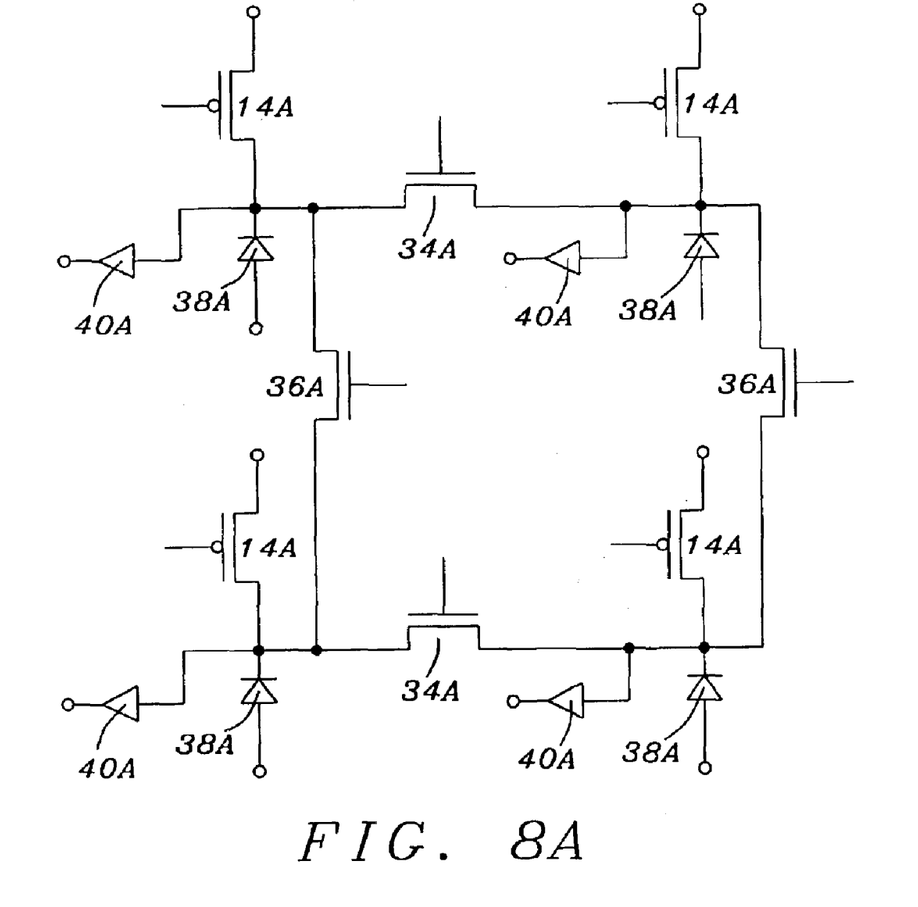
FIG. 8A shows a schematic view of four of the pixels of FIG. 6 wherein the binning connections are NMOS transistors.

FIG. 8A shows a schematic diagram of an array of four photodiodes 38A arranged in two rows and two columns. The photodiodes 38A correspond to the PN junction between the N⁻ and the P⁻ epitaxial layer forming the pixel. The reset PMOS transistors 14A are shown connected to each photodiode 38A. The NMOS binning transistors 34A between adjacent photodiodes 38A in adjacent columns and the binning NMOS transistors 36A between adjacent photodiodes 38A in adjacent rows are shown in FIG. 8A. An output amplifier 40A for each photodiode 38A is shown in FIG. 8A. In the operation of the imager the incident signal caused charge to accumulate in the pixel during an integration period when charge is stored by the photodiode 38A. Following the readout cycle the reset transistors 14A are turned on to reset the photodiodes 38A. The binning transistors, 34A and 36A, are turned on and remain turned on while the reset transistors 14A are turned of. Since the binning transistors are turned on the charge injected when the reset transistors 14A are turned off is averaged among the binned photodiodes which minimizes pixel-to-pixel noise caused by reset. In the conventional active pixel sensor array the reset transistor resets each photodiode individually, since binning is not used, resulting in greater pixel-to-pixel noise caused by reset.

Refer now to FIGS. 1–7 and 8B for a detailed description of another preferred embodiment of the circuit and method of this invention. FIG. 1 shows part of an active pixel sensor, APS, array with four pixels 12 shown in FIG. 1. Each of the pixels 10 comprise a P⁻ well 12 formed in a layer of N⁻ epitaxial silicon 16. The junction between these P⁻ wells and the N⁻ substrate forms a number of photodiodes. A reset transistor 14 is formed in each of the P⁻ wells 12 and is used to reset the pixel after the charge integration period has been completed and the charge accumulated by the pixel has been read. As an example the reset transistor 14 is an N channel metal oxide semiconductor, NMOS, transistor formed in each of the P⁻ wells. The P⁻ well is reverse biased relative to the N⁻ epitaxial silicon layer. During the first part of the cycle a signal incident on the pixel causes the charge stored at this reverse biased PN junction to decay. This signal is usually optical radiation but other signals may cause this charge decay as well. After the charge on the pixel has been read the NMOS transistor can be turned on to inject positive charge into the P⁻ well and restore the pixel charge to its initial value.

FIGS. 2 and 3 show a more detailed view of the reset transistor. FIG. 2 shows a top view and FIG. 3 a cross section view taken along line 3–3' of FIG. 2. Two N regions 18 are formed in the P⁻ well to form source and drain regions. A gate oxide 22 is formed over the part of the P⁻ well between the two N regions 18, see FIG. 2. An electrical contact 21 is formed to the gate electrode 20 and an electrical contact 19 is formed to one of the N regions 18 to form a source connection. The other N region 18 forms the drain and is in contact with the P⁻ well forming the connection to the photodiode formed by the P⁻ well and the N⁻ substrate.

FIG. 1 shows a number of interconnections 22 between selected adjacent pixels. These interconnections can be conductive traces which form a hard connection between selected P⁻ wells 12 or can be switches which can be programmed to select different combinations of P⁻ wells 12 at different times. FIGS. 4 and 5 show the case where the interconnections are switches formed by P channel metal oxide semiconductor, PMOS, transistors. FIG. 4 shows a top view and FIG. 5 a cross section view, taken along line 5–5' of FIG. 4, of two adjacent P⁻ wells 12 connected by a PMOS binning transistor. The P⁻ wells 12 each have an NMOS reset transistor 14 formed therein. The PMOS binning transistor is formed by forming an P⁺ channel region 23 between two adjacent P⁻ wells 12, see FIG. 5. A gate electrode 28 is formed over the P⁺ channel region 23 with a layer of gate dielectric 22 formed between the gate electrode 28 and the P⁺ channel region 23, see FIG. 5. A layer of second dielectric 26 is formed over the gate electrode 28 and the layer of gate dielectric 22 so that a conducting electrode 24 can be routed across the pixel array to contact the gate electrodes.

Returning to FIG. 1 the interconnections between selected P⁻ wells 12 can be conductive traces which form permanent binning connections. FIG. 6 is a cross section view of two adjacent P⁻ wells of FIG. 1 taken along line 6–6' of FIG. 1 showing permanent binning connections. As shown in FIG. 6 a layer of dielectric 52 is formed over the P⁻ wells 12 and the intervening N⁻ epitaxial silicon 16. A conducting electrode 50 is formed on the layer of dielectric 52. Electrical contacts 54 are then formed through the dielectric 52 between each end of the conducting electrode 50 and the two P⁻ wells 12.

FIG. 7 shows a top view of a part of an array of P⁻ wells 12, or pixels, arranged in rows and columns with an NMOS reset transistor 14 in each of the P⁻ wells. FIG. 7 shows four rows; 100, 101, 102, and 103; of P⁻ wells 12 and four columns; 200, 201, 202, 203; of P⁻ wells 12. While the part of the array shown in FIG. 7 shows four rows and four columns of pixels there could be more or fewer than four rows of P⁻ wells 12 and more or fewer than four columns of P⁻ wells 12. In the array shown in FIG. 7 the binning connections are PMOS transistors as previously described. Vertical electrodes 30 between selected columns of P⁻ wells 12, between columns 200 and 201 and between columns 202 and 203, form electrical connection to the gate electrodes 22 of the PMOS binning transistors connecting the P⁻ wells 12 in one of the selected columns to the adjacent P⁻ wells 12 in the adjacent selected column. In this example the connections are between each of the P⁻ wells 12 in column 200 and the adjacent P⁻ wells 12 in column 201 and between each of the P⁻ wells 12 in column 202 and the adjacent P⁻ wells 12 in column 203.

In like manner, horizontal electrodes 32 between selected rows of P⁻ wells 12 form electrical connection to the gate electrodes 22 of the PMOS binning transistors connecting the P⁻ wells 12 in one of the selected rows to the adjacent P⁻ wells 12 in the adjacent selected row. In this example the connections are between each of the P⁻ wells 12 in row 100 and the adjacent P⁻ wells 12 in row 101 and between each of the P⁻ wells 12 in row 102 and the adjacent P⁻ wells 12 in row 103. The connections shown in this example result in sub-arrays of four P⁻ wells which can be binned in groups of two or four depending on which PMOS binning transistors are turned on and isolated from one another when the PMOS transistors are turned off. Different arrays and different electrical connections can aggregate different sub arrays when the binning transistors are turned on. An entire array of P⁻ wells could be binned if that were desired.

Figure 8B:
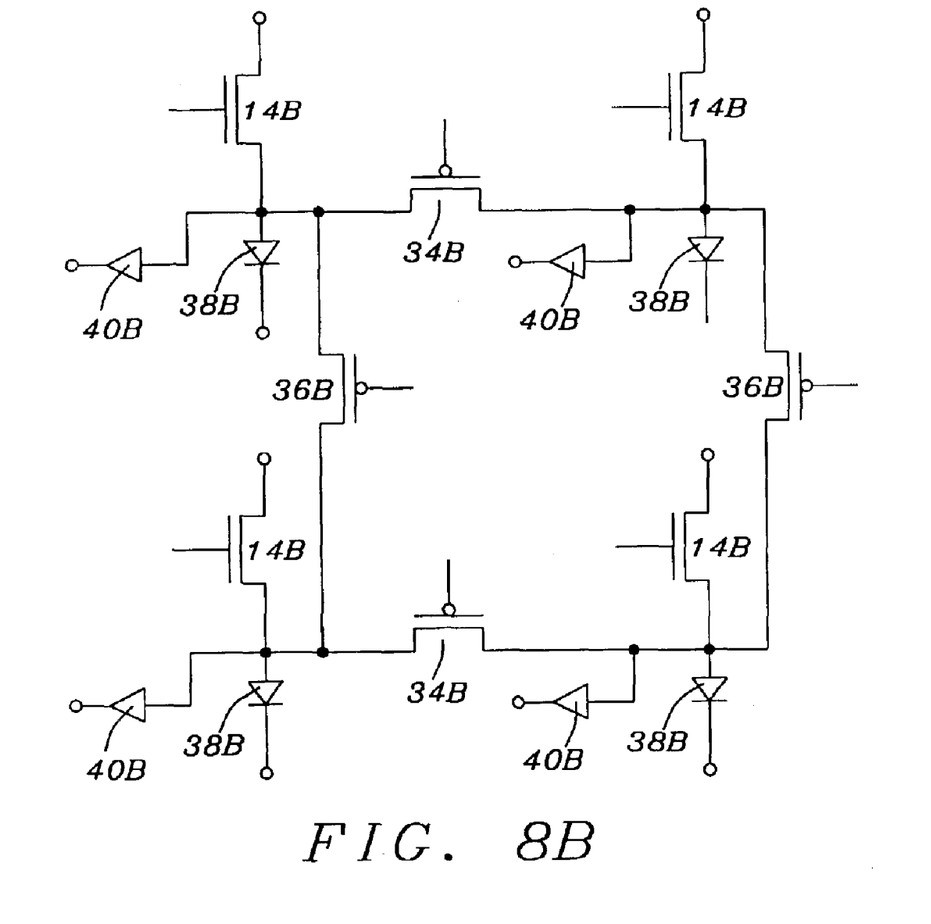
FIG. 8B shows a schematic view of four of the pixels of FIG. 6 wherein the binning connections are PMOS transistors.

FIG. 8B shows a schematic diagram of an array of four photodiodes 38B arranged in two rows and two columns. The photodiodes 38B correspond to the PN junction between the P⁻ well and the N⁻ epitaxial layer forming the pixel. The reset NMOS transistors 14B are shown connected to each photodiode 38B. The PMOS binning transistors 34B between adjacent photodiodes 38B in adjacent columns and the binning PMOS transistors 36B between adjacent photodiodes 38B in adjacent rows are shown in FIG. 8B. An output amplifier 40B for each photodiode 38B is shown in FIG. 8B. In the operation of the imager the incident signal, such as optical, radiation caused charge to accumulate in the pixel during an integration period when charge is stored by the photodiode 38B. Following the readout cycle the reset transistors 14B are turned on to reset the photodiodes 38B. The binning transistors, 34B and 36B, are turned on and remain turned on while the reset transistors 14B are turned of. Since the binning transistors are turned on the charge injected when the reset transistors 14B are turned off is averaged among the binned photodiodes which minimizes pixel-to-pixel noise caused by reset. In the conventional active pixel sensor array the reset transistor resets each photodiode individually, since binning is not used, resulting in greater pixel-to-pixel noise caused by reset.

Figure 9:
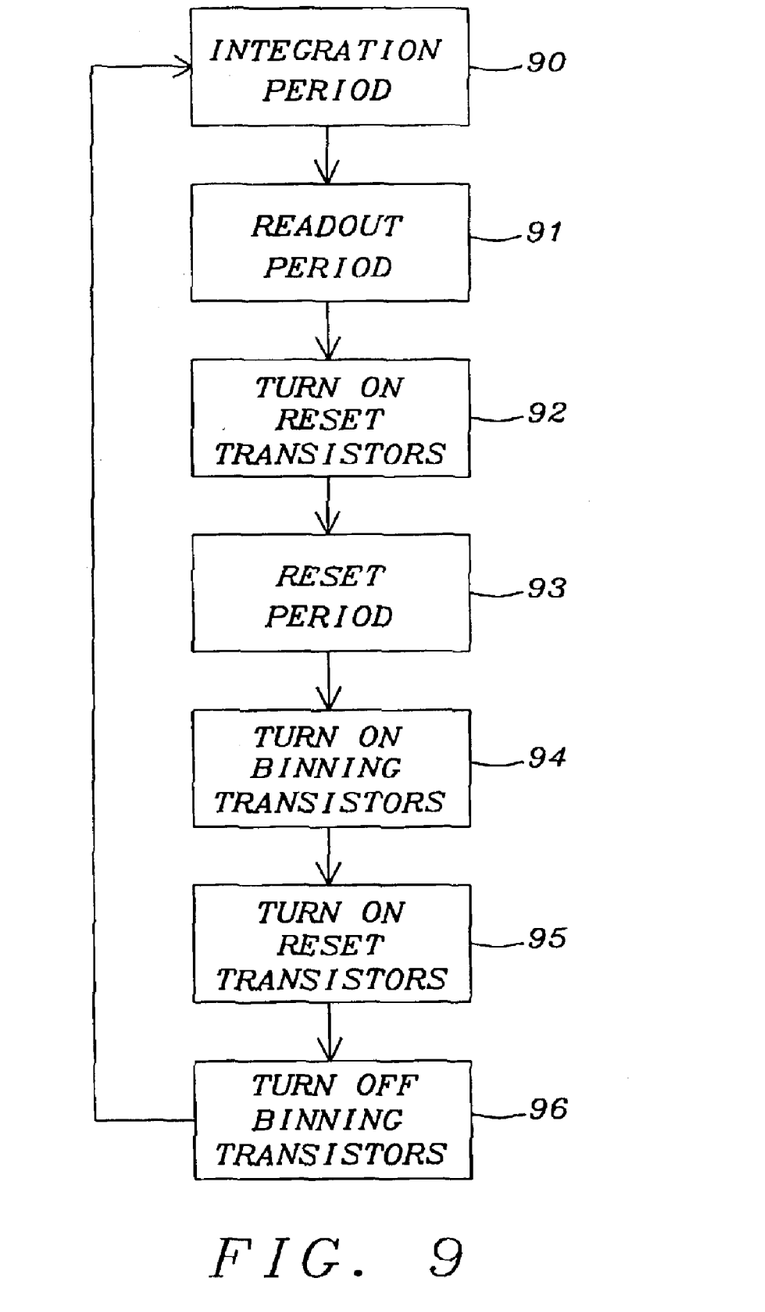
FIG. 9 shows a block diagram for the method of this invention.

FIG. 9 shows a block diagram showing the method of this invention. As shown in the first block 90 the imager accumulates charge in the pixels during an integration period when charge is stored by the photodiodes. Next, during the readout period, as shown by the second block 91, the charge on the pixels is read out to a suitable location such as a register. As shown in the third and fourth blocks, 92 and 93, after the readout period has been completed the reset transistors are turned on and a reset period occurs when the initial charge on the photodiodes is restored. As shown in the next three blocks; 94, 95, and 96; after the reset period has been completed the binning transistors are turned on while the reset transistors are still on. The reset transistors are then turned off while the binning transistors are on. Having the binning transistors on when the reset transistors are turned off is key to the noise suppression of this method. Next, after the reset transistors have been turned off the binning transistors are turned off and the cycle can begin again with the next integration period.

Although the binning gates have been shown in the context of a sensor array in which the photosensitive elements are formed from N⁻ wells in a P⁻ type substrate or P⁻ type wells in an N⁻ type substrate the binning gates could be implemented in arrays having conventional CMOS pixel structures.

While the invention has been particularly shown and described with reference to the preferred embodiments thereof, it will be understood by those skilled in the art that various changes in form and details may be made without departing from the spirit and scope of the invention.

What is claimed is:

1. An imaging circuit, comprising:
 a P⁻ type epitaxial silicon substrate;
 an array of a number of N⁻ well pixel cells in said P⁻ type epitaxial substrate, wherein each of said N⁻ well pixel cells is surrounded by said P⁻ type epitaxial silicon; and
 binning connections between selected adjacent N⁻ well pixel cells which can be used to selectively bin said selected adjacent N⁻ well pixel cells, wherein any number of said N⁻ well pixel cells can be binned during pixel reset, including the entire array of N⁻ pixel cells if desired, thereby reducing noise during pixel reset.

2. The imaging circuit of claim 1 wherein said binning connections comprise N⁺ silicon between said selected adjacent N⁻ well pixel cells.

3. The imaging circuit of claim 2 wherein said N⁺ silicon between selected adjacent N⁻ well pixel cells is used to form an NMOS transistor between those selected adjacent N⁻ well pixel cells thereby forming an optional binning switch.

4. The imaging circuit of claim 1 wherein said binning connections comprise conductive traces between said selected adjacent N⁻ well pixel cells.

5. The imaging circuit of claim 1 wherein each of said each of said N⁻ well pixel cells has a first P region and a second P region formed therein.

6. The imaging circuit of claim 5 wherein said first P region and said second P region are used to form a PMOS transistor in each of said N⁻ well pixel cells and said PMOS transistor can be used to reset that said N⁻ well pixel cell.

7. The imaging circuit of claim 1 wherein the junction between each of said N⁻ well pixel cells and said P⁻ type epitaxial silicon forms a photodiode.

8. The imaging circuit of claim 7 wherein said photodiode stores a charge produced by light energy.

9. A method of pixel reset noise suppression, comprising:
 providing a P⁻ type epitaxial silicon substrate;
 providing an array of a number of N⁻ well pixel cells in said P⁻ type epitaxial substrate, wherein each of said N⁻ well pixel cells is surrounded by said P⁻ type epitaxial silicon;
 forming binning connections between selected adjacent N⁻ well pixel cells which can be used to selectively bin adjacent N⁻ well pixel cells; and
 selectively binning adjacent N⁻ well pixel cells during the time said N⁻ well pixel cells are being reset wherein any number of said adjacent N⁻ well pixel cells can be binned, including the entire array of said N⁻ well pixel cells if desired, thereby reducing noise during pixel reset.

10. The method of claim 9 wherein said binning connections comprise N⁺ silicon between said selected adjacent N⁻ well pixel cells.

11. The method of claim 10 wherein said N⁺ silicon between selected adjacent N⁻ well pixel cells forms an NMOS transistor between those selected adjacent N⁻ well pixel cells thereby forming an optional binning switch.

12. The method of claim 9 wherein said binning connections comprise conductive traces between said selected adjacent N⁻ well pixel cells.

13. The method of claim 9 wherein each of said each of said N⁻ well pixel cells has a first P region and a second P region formed therein.

14. The method of claim 13 wherein said first P region and said second P region are used to form a PMOS transistor and said PMOS transistor can be used to reset that said N⁻ well pixel cell.

15. The method of claim 9 wherein the junction between each of said N⁻ well pixel cells and said P⁻ type epitaxial silicon is used as a photodiode.

16. The method of claim 15 wherein said photodiode stores a charge produced by light energy.

17. An imaging circuit, comprising:
 an N⁻ type epitaxial silicon substrate;
 an array of a number of P⁻ well pixel cells in said N⁻ type epitaxial substrate, wherein each of said P⁻ well pixel cells is surrounded by said N⁻ type epitaxial silicon; and
 binning connections between selected adjacent P⁻ well pixel cells which can be used to selectively bin said selected adjacent P⁻ well pixel cells, wherein any number of said P⁻ well pixel cells can be binned during pixel reset, including the entire array of P⁻ pixel cells if desired, in order to reduce noise during pixel reset.

18. The imaging circuit of claim 17 wherein said binning connections comprise P⁺ silicon between said selected adjacent P⁻ well pixel cells.

19. The imaging circuit of claim 18 wherein said P⁺ silicon between selected adjacent P⁻ well pixel cells is used to form a PMOS transistor between those selected adjacent P⁻ well pixel cells thereby forming an optional binning switch.

20. The imaging circuit of claim 17 wherein said binning connections comprise conductive traces between said selected adjacent P⁻ well pixel cells.

21. The imaging circuit of claim 17 wherein each of said each of said P⁻ well pixel cells has a first N region and a second N region formed therein.

22. The imaging circuit of claim 21 wherein said first N region and said second N region are used to form an NMOS transistor in each of said P⁻ well pixel cells and said NMOS transistor can be used to reset that said P⁻ well pixel cell.

23. The imaging circuit of claim 17 wherein the junction between each of said P⁻ well pixel cells and said N⁻ type epitaxial silicon forms a photodiode.

24. The imaging circuit of claim 23 wherein said photodiode stores a charge produced by light energy.

25. A method of pixel reset noise suppression, comprising:
 providing an N⁻ type epitaxial silicon substrate;
 providing an array of a number of P⁻ well pixel cells in said N⁻ type epitaxial substrate, wherein each of said P⁻ well pixel cells is surrounded by said N⁻ type epitaxial silicon;
 forming binning connections between selected adjacent P⁻ well pixel cells which can be used to selectively bin adjacent P⁻ well pixel cells; and
 selectively binning adjacent P⁻ well pixel cells during the time said P⁻ well pixel cells are being reset, wherein any number of said P⁻ well pixel cells can be binned, including the entire array of P⁻ pixel cells if desired, in order to reduce noise during pixel reset.

26. The method of claim 25 wherein said binning connections comprise P⁺ silicon between said selected adjacent P⁻ well pixel cells.

27. The method of claim 25 wherein said P⁺ silicon between selected adjacent P⁻ well pixel cells forms a PMOS transistor between those selected adjacent P⁻ well pixel cells thereby forming an optional binning switch.

28. The method of claim 25 wherein said binning connections comprise conductive traces between said selected adjacent P⁻ well pixel cells.

29. The method of claim 25 wherein each of said each of said P⁻ well pixel cells has a first N region and a second N region formed therein.

30. The method of claim 29 wherein said first N region and said second N region are used to form an NMOS transistor and said NMOS transistor can be used to reset that said P⁻ well pixel cell.

31. The method of claim 25 wherein the junction between each of said P⁻ well pixel cells arid said N⁻ type epitaxial silicon is used as a photodiode.

32. The method of claim 31 wherein said photodiode stores a charge produced by light energy.

* * * * *

UNITED STATES PATENT AND TRADEMARK OFFICE
CERTIFICATE OF CORRECTION

PATENT NO. : 6,878,918 B2
DATED : April 12, 2005
INVENTOR(S) : Taner Dosluogli

It is certified that error appears in the above-identified patent and that said Letters Patent is hereby corrected as shown below:

Title page,
Item [73], Assignee, delete "Dialdg Semiconductor GmbH, Kirchheim (DE)" and replace with -- Dialog Semiconductor GmbH, Kirchheim/Teck-Nabern (DE) --.

Signed and Sealed this

Fourteenth Day of June, 2005

JON W. DUDAS
*Director of the United States Patent and Trademark Office*